US006892450B2

(12) United States Patent
Ohba et al.

(10) Patent No.: US 6,892,450 B2
(45) Date of Patent: May 17, 2005

(54) METHOD OF MOUNTING LIGHT EMITTING DEVICE AND METHOD OF FABRICATING IMAGE DISPLAY UNIT

(75) Inventors: Hisashi Ohba, Kanagawa (JP); Kunihiko Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 36 days.

(21) Appl. No.: 10/213,200

(22) Filed: Aug. 5, 2002

(65) Prior Publication Data

US 2003/0070274 A1 Apr. 17, 2003

(30) Foreign Application Priority Data

Aug. 6, 2001 (JP) ..................................... P2001-237579

(51) Int. Cl.[7] .................................................. H05K 3/30

(52) U.S. Cl. ............................. 29/832; 29/825; 29/840; 349/73; 349/156

(58) Field of Search ..................... 29/832, 825; 349/73, 349/156

(56) References Cited

U.S. PATENT DOCUMENTS 3,861,783 A * 1/1975 Dill et al. ................... 349/156
5,258,320 A 11/1993 Zavracky et al.
5,438,241 A 8/1995 Zavracky et al.
6,005,649 A * 12/1999 Krusius et al. ............... 349/73
6,476,886 B2 * 11/2002 Krusius et al. ............... 349/73
6,492,699 B1 * 12/2002 Glenn et al. ................ 257/433
6,556,261 B1 * 4/2003 Krusius et al. ............... 349/73
6,567,138 B1 * 5/2003 Krusius et al. ............... 349/73

FOREIGN PATENT DOCUMENTS

EP 0 905 673 A1 3/1999
JP 56-17385 2/1981
JP 60-181778 9/1985
JP 02-114196 4/1990
JP 08-107293 4/1996

* cited by examiner

*Primary Examiner*—Carl J. Arbes
(74) *Attorney, Agent, or Firm*—Bell, Boyd & Lloyd LLC

(57) ABSTRACT

Light emitting devices formed in an array on a first substrate are transferred to an insulating material, to form a sheet-shaped device substrate. The sheet-shaped device substrate is cut along an array direction of the light emitting devices into long-sized line-shaped device substrates. The line-shaped device substrates are arrayed on a second substrate such that the line-shaped device substrates are enlargedly spaced from each other. The line-shaped device substrates divided from the second substrate are arrayed on a third substrate such as to be enlargedly spaced from each other.

3 Claims, 19 Drawing Sheets

METHOD OF MOUNTING LIGHT EMITTING DEVICE AND METHOD OF FABRICATING IMAGE DISPLAY UNIT

BACKGROUND OF THE INVENTION

The present invention relates to a method of efficiently arraying light emitting devices, and a method of fabricating an image display unit using a mounting method.

The assembly of an image display unit by arraying light emitting devices in a matrix is performed in two manners. For a liquid crystal display (LCD) or a plasma display panel (PDP), the light emitting devices are directly formed on a substrate, and for a light emitting diode display (LED display), single LED packages are arrayed on a substrate. In particular, for an image display unit such as an LCD or PDP, device isolation cannot be performed and accordingly, in general, at the beginning of the production process, devices are formed such as to be spaced from each other with a pitch equivalent to a pixel pitch of the image display unit.

Conversely, for an image display unit such as an LED display, LED chips are packaged by taking out LED chips after dicing, and individually connecting the LED chips to external electrodes by wire-bonding or bump-connection using flip-chip. In this case, before or after packaging, the LED chips are arrayed with a pixel pitch of the image display unit. However, such a pixel pitch is independent from an array pitch of the devices at the time of formation of the devices.

Since an LED (Light Emitting Diode) as a light emitting device is expensive, an image display unit using such LEDs can be produced at a low cost by producing a large number of LEDs from one wafer. Specifically, the cost of an image display unit can be lowered by reducing the size of an LED chip from an ordinary size, about 300 m square to several ten m square, and producing an image display unit by connecting such small-sized LED chips to each other.

When taking out LED chips after the dicing step and individually mounting the LED chips, since each of the LED chips has a micro-size, the step of mounting the LED chips is significantly complicated, to thereby significantly degrade the productivity. Also, when individually mounting LED chips, there occurs a problem associated with positional accuracy, for example, a difficulty in mounting the LED chips with a constant array pitch.

SUMMARY OF THE INVENTION

An object of the present invention is, therefore, to provide a method of mounting a light emitting device, which is capable of efficiently mounting light emitting devices while easily ensuring a positional accuracy at the time of mounting the light emitting devices, and a method of fabricating an image display unit using the mounting method.

According to an embodiment of the present invention, there is provided a method of mounting a light emitting device, including the steps of collectively handling a number of light emitting devices in a state being arrayed in a row, and mounting the number of light emitting devices arrayed in a row on a substrate at once.

According to another embodiment of the present invention, there is provided a method of mounting a light emitting device, including the steps of arraying first light emitting device rows, in each of which light emitting devices are arrayed in a row, in parallel to each other, cutting the first light emitting device rows in such a manner that the light emitting devices in each of the first light emitting device rows are separated from each other, to form second light emitting device rows in each of which the light emitting devices are arrayed in a row along a direction different from an array direction of the light emitting devices arrayed in each of the first light emitting device rows, and mounting the second light emitting device rows on a substrate.

According to yet another embodiment of the present invention, there is provided a method of mounting a light emitting device, including the steps of transferring light emitting devices formed in an array on a first substrate to an insulating material, to form a sheet-shaped device substrate, cutting the sheet-shaped device substrate along an array direction of the light emitting devices into long-sized line-shaped device substrates, and arraying the line-shaped device substrates on a second substrate such that the line-shaped device substrates are spaced from each other with an enlarged pitch.

According to an embodiment of the present invention, there is provided a method of fabricating an image display unit, including the steps of transferring light emitting devices formed in an array on a first substrate to an insulating material, to form a sheet-shaped device substrate, cutting the sheet-shaped device substrate along an array direction of the light emitting devices into long-sized line-shaped device substrates, and arraying the line-shaped device substrates on a second substrate such that the line-shaped device substrates are spaced from each other with an enlarged pitch.

It is very complicated to handle light emitting devices having micro-sizes in a state being individually isolated from each other. According to an embodiment of the present invention, light emitting devices are buried in an insulating material, to form a resin sheet, and the resin sheet is cut into line-shaped device substrates. As a result, since the light emitting devices can be collectively handled in a state being arrayed on one row, it is possible to significantly improve the mounting efficiency and since the array pitch of the light emitting devices in one row is not deviated, it is possible to enhance the mounting accuracy.

Additional features and advantages of the present invention are described in, and will be apparent from, the following Detailed Description of the Invention and the Figures.

BRIEF DESCRIPTION OF THE FIGURES

FIG. 12 is a schematic sectional view showing a step of overlapping a temporarily holding member to a first substrate provided with light emitting devices via an UD adhesive, wherein FIGS. 12 to FIG. 29 are views illustrating a method of fabricating line-shaped device substrates.

FIG. 13 is a schematic sectional view showing a step of curing a UV-curing agent.

FIG. 14 is a schematic sectional view showing a step of irradiating the light emitting devices with laser beams for causing laser abrasion.

FIG. 15 is a schematic sectional view showing a step of peeling the first substrate from the temporarily holding member.

FIG. 16 is a schematic sectional view showing a step of removing gallium from the peeled plane of each of the light emitting devices.

FIG. 17 is a schematic sectional view showing a step of dicing the adhesive for isolating the light emitting devices from each other.

FIG. 18 is a schematic sectional view showing a step of overlapping a second temporarily holding member to the first temporarily holding member via an UV adhesive.

FIG. 19 is a schematic sectional view showing a step of causing selective laser abrasion and curing the UV adhesive by UV exposure.

FIG. 20 is a schematic sectional view showing a step of selectively separating the light emitting devices from the first temporarily holding member.

FIG. 21 is a schematic sectional view showing a step of burying a target light emitting device in a resin layer.

FIG. 22 is a schematic sectional view showing a step of reducing the thickness of the resin layer.

FIG. 23 is a schematic sectional view showing a step of forming a via-hole in the resin layer.

FIG. 24 is a schematic sectional view showing a step of forming an anode-side electrode pad.

FIG. 25 is a schematic sectional view showing a step of bonding a third temporarily holding member to the resin layer and irradiating the target light emitting device with laser beams for causing laser abrasion.

FIG. 26 is a schematic sectional view showing a step of separating the second temporarily member from the resin layer.

FIG. 27 is a schematic sectional view showing a step of exposing a contact semiconductor layer.

FIG. 28 is a schematic sectional view showing a step of forming a cathode side electrode pad.

FIG. 29 is a schematic sectional view showing a step of cutting the resin layer and adhesive by laser dicing.

DETAILED DESCRIPTION OF THE INVENTION

First, an embodiment for illustrating a basic configuration of a method of mounting a light emitting device and a method of fabricating an image display unit according to the present invention will be described below.

In general, light emitting devices are collectively formed on a wafer and cut into chips by dicing, and then the chips are mounted to a mounting substrate. On the contrary, according to an embodiment of the present invention, a number of light emitting devices formed in array on a wafer are collectively buried in a resin representative of an insulating material, and then the light emitting devices are handled in the form of a resin sheet.

To be more specific, according to an embodiment of the present invention, a number of light emitting devices formed in array on a wafer are first buried in an insulating material (resin material), and are then transferred in such a state.

Figure 1:
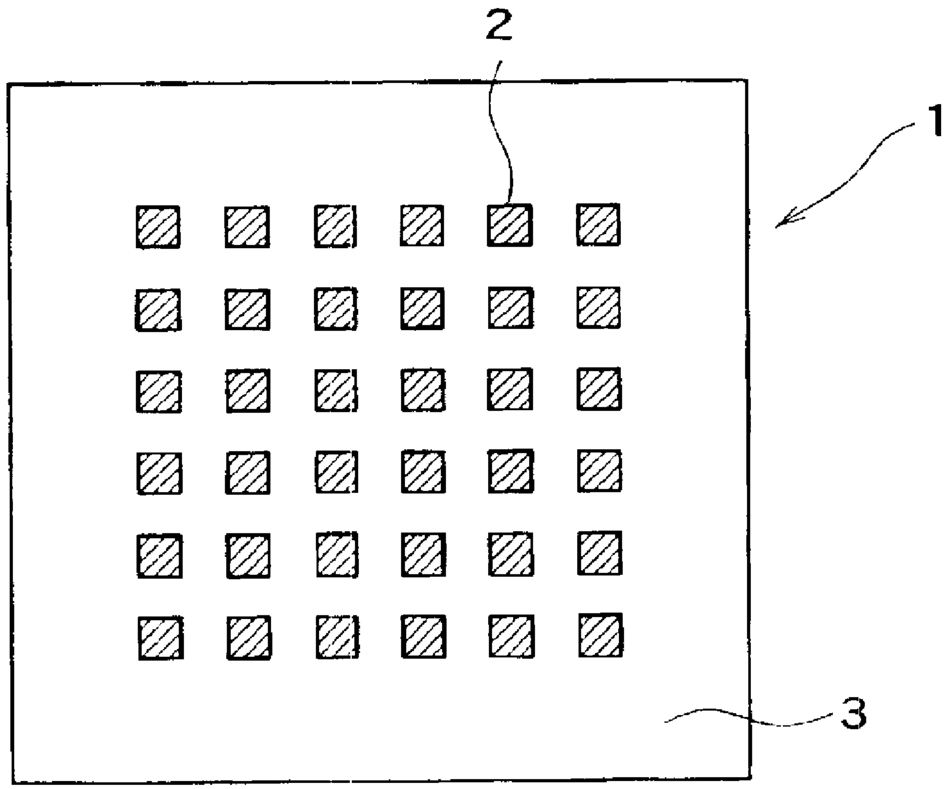
FIG. 1 is a plan view typically showing a sheet-like device substrate.

FIG. 1 shows a state that light emitting devices (LEDs) 2 formed in an array on a wafer are transferred to a resin sheet 3. After the light emitting devices 2 are transferred to the resin sheet 3, the wafer is peeled from the light emitting devices 2, to obtain a sheet-shaped device substrate 1 composed of the resin sheet 3 in which the light emitting devices 2 are buried. The light emitting devices 2 may be transferred from the wafer to the resin sheet 3 such as to be arrayed with the same pitch as that of the light emitting devices 2 arrayed on the wafer, or to be arrayed while being enlargedly spaced from each other with a specific pitch larger than that of the light emitting devices 2 arrayed on the wafer. The transfer is performed as follows: namely, after the light emitting devices 2 on the wafer are buried in the resin sheet 3, the wafer is peeled from the light emitting devices 2 by making use of laser abrasion and simultaneously the resin material of the resin sheet 3 is cured, whereby the light emitting devices 2 are transferred to the resin sheet 3.

Figure 2A:
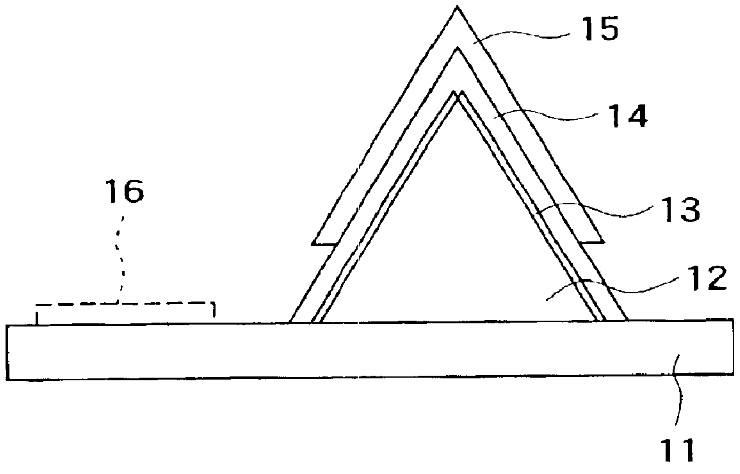
FIGS. 2A and 2B are a sectional view and a plan view, showing one example of a light emitting device, respectively.
Figure 2B:
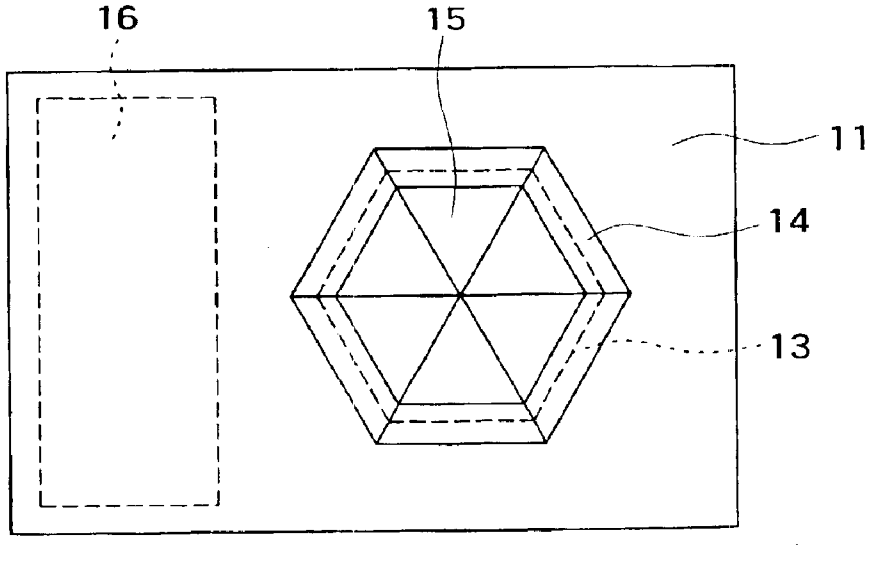

FIGS. 2A and 2B are a sectional view and a plan view, showing one example of the light emitting device used for this embodiment, respectively.

The light emitting device used in this embodiment is specified by a GaN based light emitting diode formed on a sapphire substrate by crystal growth. In such a GaN based light emitting diode, laser abrasion occurs by irradiating the light emitting diode with laser beams passing through the sapphire substrate, to evaporate nitrogen of GaN, thereby causing film peeling at the interface between the sapphire substrate and a GaN based growth layer. As a result, the light emitting diodes can be easily peeled from the sapphire substrate.

The structure of the GaN based light emitting diode will be described below. A hexagonal pyramid shaped GaN layer 12 is formed by selective growth on an under growth layer 11 composed of a GaN based semiconductor layer. To be more specific, an insulating film (not shown) is formed on the under growth layer 11, and the hexagonal pyramid shaped GaN layer 12 is grown from an opening formed in the insulating film by a MOCVD process or the like. The GaN layer 12 is a growth layer having a pyramid shape covered with a S-plane, that is, (1–101) plane when a principal plane of a sapphire substrate used for growth is taken as a C-plane. The GaN layer 12 is a region doped with silicon. The tilt S-plane portion of the GaN layer 12 functions as a cladding portion of a double-hetero structure. An InGaN layer 13 functioning as an active layer is formed such as to cover the tilt S-plane of the GaN layer 12. A GaN layer 14 doped with magnesium is formed on the InGaN layer 13. The GaN layer 14 doped with magnesium also functions as a cladding portion.

The light emitting diode has a p-electrode 15 and an n-electrode 16. A metal material such as Ni/Pt/Au or Ni(Pd)/Pt/Au is vapor-deposited on the GaN layer 14 doped with magnesium, to form the p-electrode 15. A metal material such as Ti/Al/Pt/Au is vapor-deposited in an opening formed in the above-described insulating film (not shown), to form the n-electrode 16. If an n-electrode is extracted from the back surface side of the under growth layer 11, the n-electrode 16 is not required to be formed on the front surface side of the under growth layer 11.

The GaN based light emitting diode having such a structure allows emission of blue light. In particular, the light emitting diode can be relatively simply peeled from the sapphire substrate by laser abrasion. In other words, the diode can be selectively peeled by selective irradiation of the diode with a laser beam. The GaN based light emitting diode may have a structure that an active layer be formed into a planar or strip shape, or may be a pyramid structure with a C-plane formed on an upper end portion of the pyramid. The GaN light emitting diode may be replaced with any other nitride based light emitting device or a compound semiconductor device.

Figure 3:
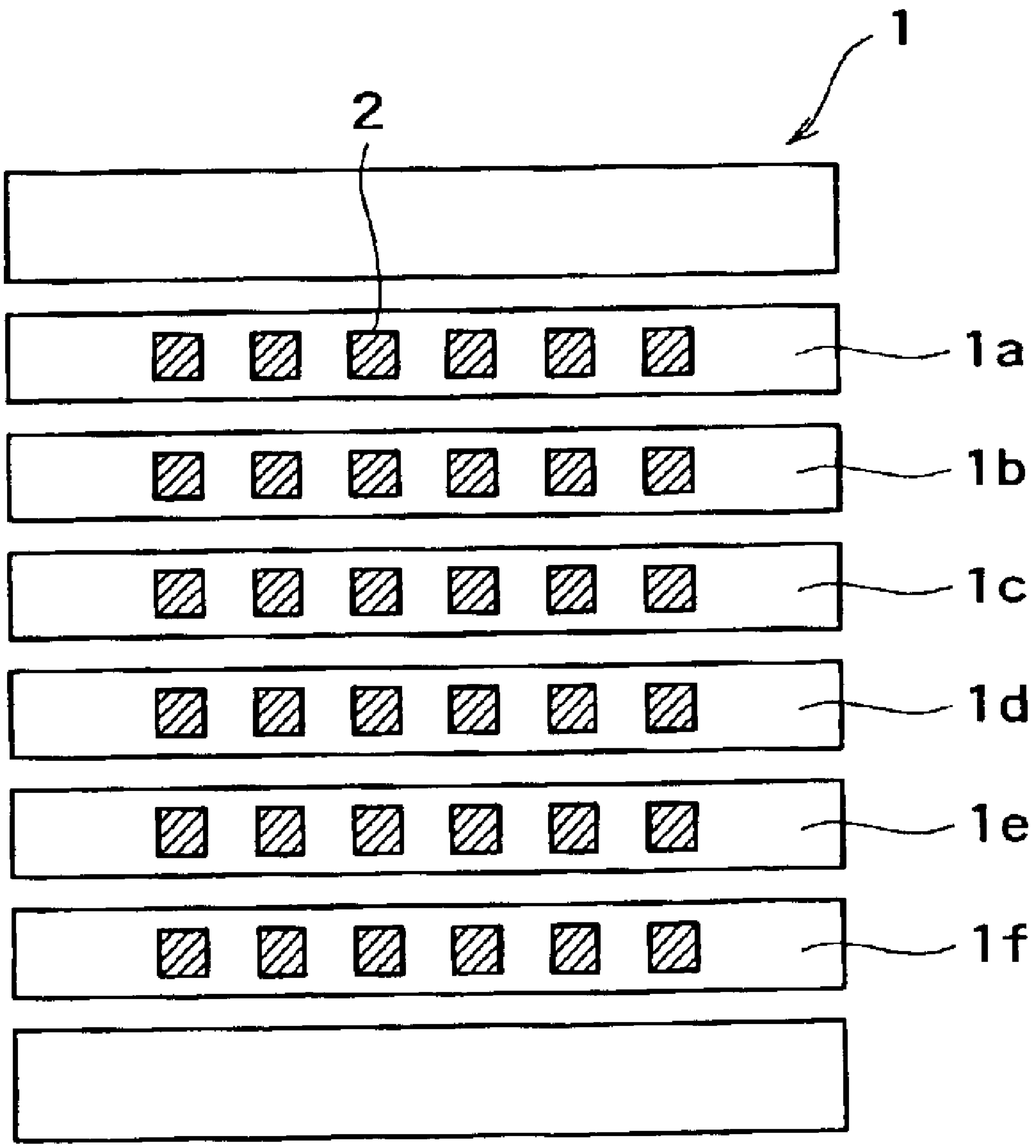
FIG. 3 is a plan view typically showing a state that a sheet-shaped device substrate is cut into line-shaped device substrates.

The sheet-shaped device substrate 1 is, as shown in FIG. 3, cut by dicing into a number (six pieces in this embodiment) of line-shaped device substrates 1*a,* 1*b,* 1*c,* 1*d,* 1*e,* and 1*f.* It is to be noted that the sheet-shaped device substrate 1 may be cut by dicing into seven or more of line-shaped device substrates 1*a,* 1*b,* 1*c,* 1*d,* 1*e,* 1*f,* . . . , 1*n* (n=integer).

This dicing step is a primary dicing step for cutting the light emitting devices 2 arrayed into a matrix for each row. Accordingly, in each of the line-shaped device substrates 1*a,* 1*b,* 1*c,* 1*d,* 1*e,* and 1*f,* the light emitting devices 2 are buried in the state being arrayed in a row, and therefore, the light emitting devices 2 arrayed in one row can be collectively handled as one line-shaped device substrate.

The line-shaped device substrates 1*a,* 1*b,* 1*c,* 1*d,* 1*e,* and 1*f* are then transferred to a primary base member 4 as a second substrate (first transfer step). The primary base member 4 may be made from a rigid material such as glass or a flexible material such as a film material. When using the base member 4 made from a film material, the base member 4 can be formed into a roll-like shape or a folded shape such as a accordion fold shape. By forming an adhesive layer on the surface of the primary base member 4, the line-shaped device substrates 1*a,* 1*b,* 1*c,* 1*d,* 1*e,* and 1*f* transferred to the primary base member 4 can be certainly fixed thereto.

Figure 4:
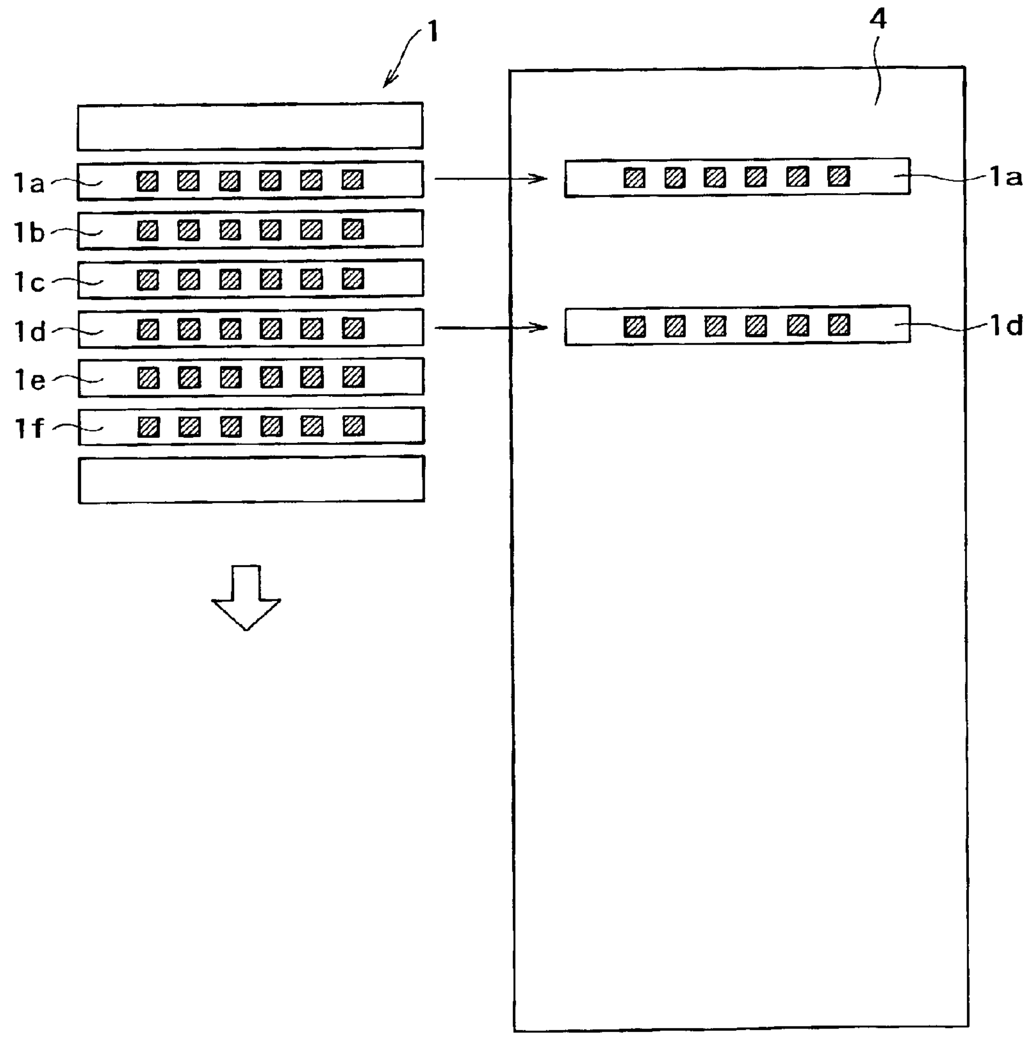
FIG. 4 is a typical view showing a first transfer in a primary transfer step.
Figure 5:
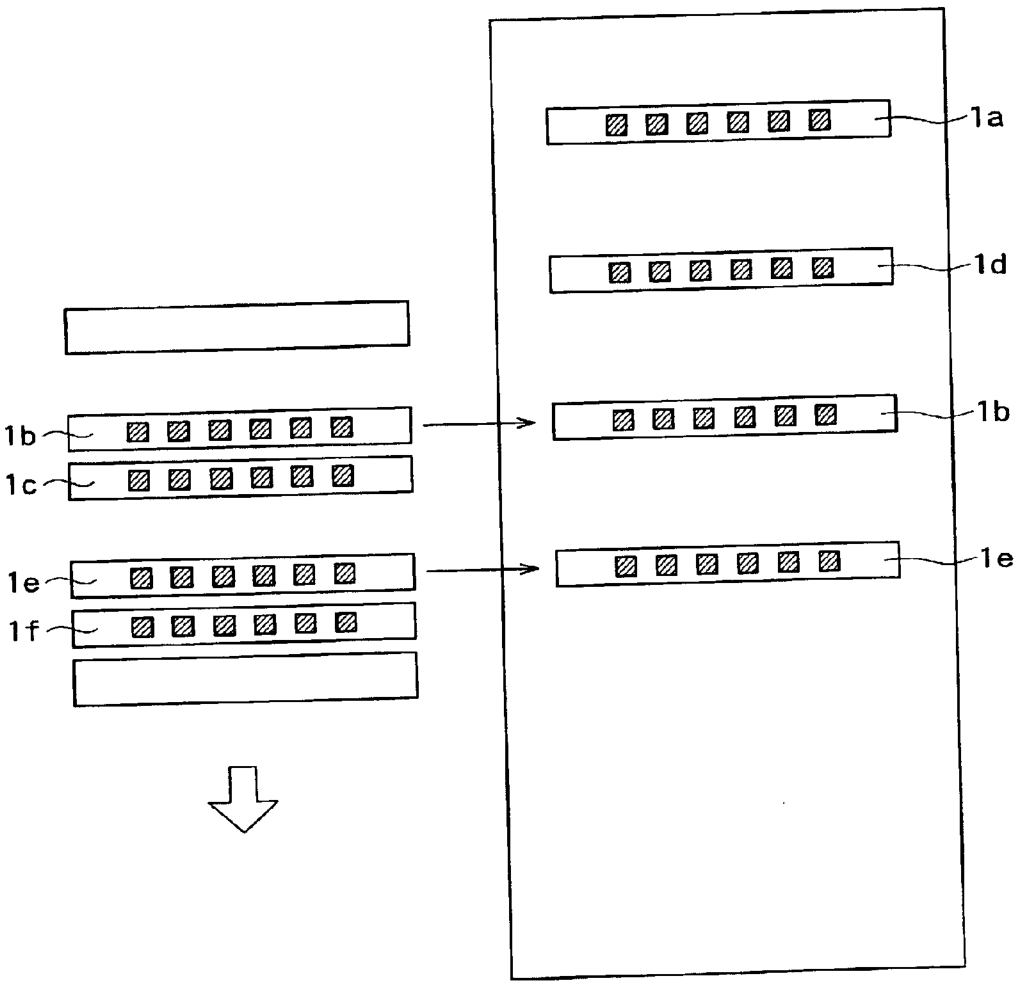
FIG. 5 is a typical view showing a second transfer in a primary transfer step.
Figure 6:
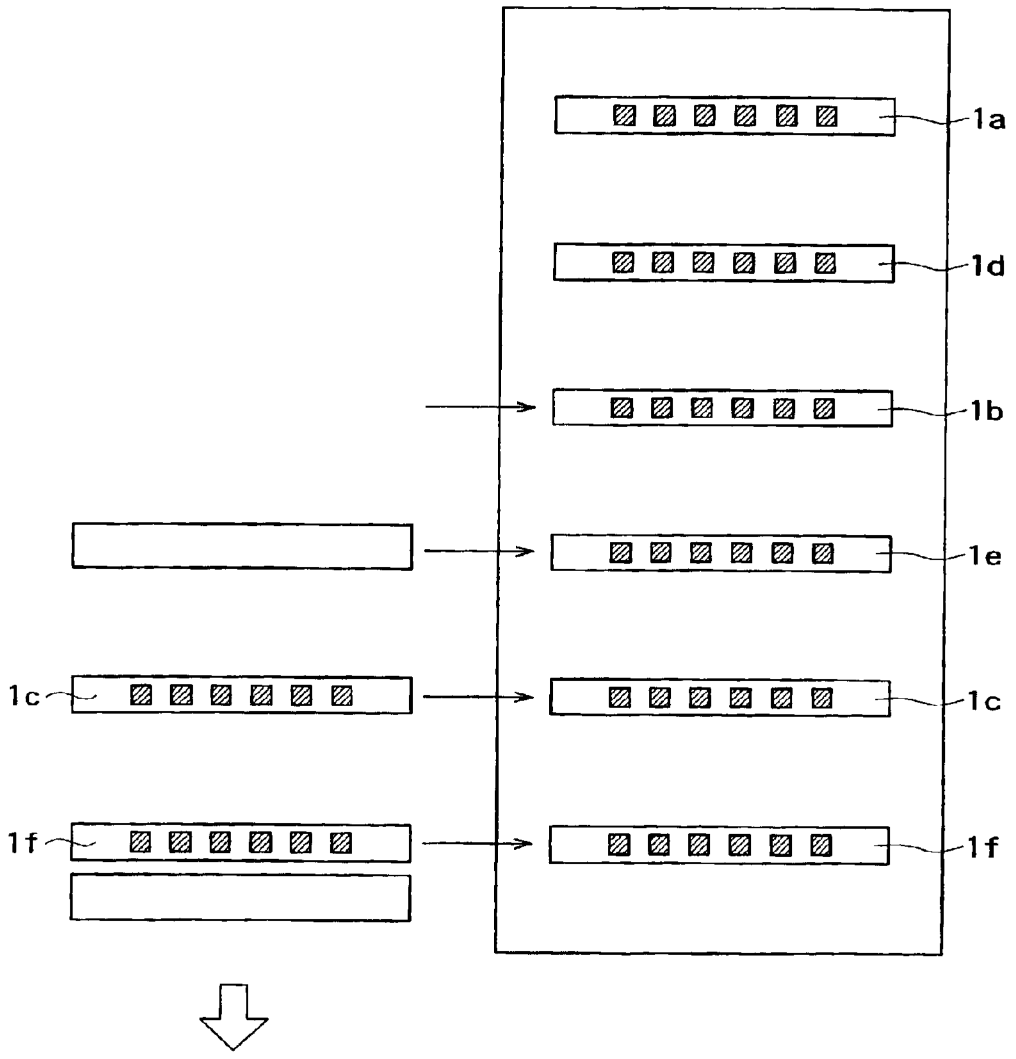
FIG. 6 is a typical view showing a third transfer in a primary transfer step.

The line-shaped device substrates 1*a,* 1*b,* 1*c,* 1*d,* 1*e,* and 1*f* are, as shown in FIGS. 4 to 6, selectively picked up, for example, every several rows and are transferred in an array on the primary base member 4. This selective transfer is repeated, so that the line-shaped device substrates 1*a,* 1*b,* 1*c,* 1*d,* 1*e,* and 1*f* are arrayed on the primary base member 4 such as to be spaced from each other with a specific pitch.

Specifically, first, as shown in FIG. 4, the line-shaped device substrates 1*a,* 1*b,* 1*c,* 1*d,* 1*e,* and 1*f* are selectively picked up every three rows, that is, the line-shaped device substrates 1*a* and 1*d* are picked up, and are transferred on the primary base member 4. Next, as shown in FIG. 5, the primary base member 4 is moved relative to the sheet-shaped device substrate 1, and the line-shaped devices 1*b,* 1*c,* 1*d* (empty), 1*e* and 1*f* are selectively picked up every three rows, that is, the line-shaped device substrates 1*b* and 1*e* are picked up, and are transferred on the primary base member 4. Finally, as shown in FIG. 6, the primary base member 4 is moved relative to the sheet-shaped device substrate 1, and the line-shaped devices 1*c,* 1*d* (empty), 1*e* (empty), and 1*f* are selectively picked up every three rows, that is, the remaining line-shaped device substrates 1*c* and 1*f* are picked up, and are transferred on the primary base member 4. As a result, the line-shaped device substrates 1*a,* 1*b,* 1*c,* 1*d,* 1*e,* and 1*f* have been transferred in array on the primary base member 4 such as to be spaced from each other with a pitch enlarged by three times.

Figure 7:
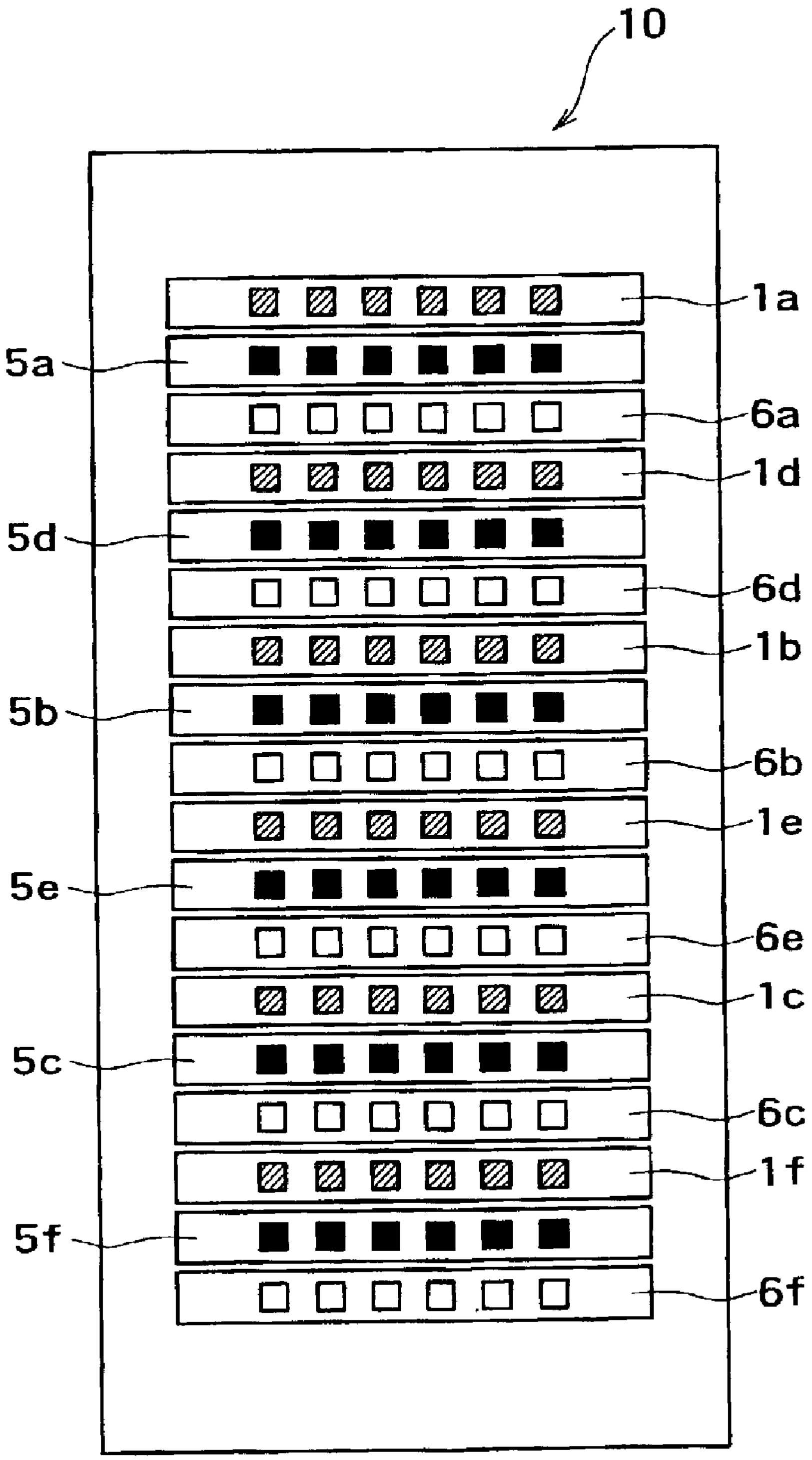
FIG. 7 is a plan view typically showing a sheet-shaped device substrate in which light emitting devices for emission of light of three colors are arrayed.

When fabricating a color image display unit, it is required to array light emitting devices for emission of light of three colors (red, green, and blue). To meet such a requirement, as shown in FIG. 7, after the line-shaped device substrates 1*a,* 1*b,* 1*c,* 1*d,* 1*e,* and 1*f* in each of which light emitting devices for emission of red light are arrayed are enlargedly transferred on the primary base member 4 in the same manner as described above, line-shaped device substrates 5*a,* 5*b,* 5*c,* 5*d,* 5*e,* and 5*f* in each of which light emitting devices for emission of green light and line-shaped device substrates 6*a,* 6*b,* 6*c,* 6*d,* 6*e,* and 6*f* in each of which light emitting devices for emission of blue light are enlargedly transferred in sequence on the primary base member 4, to obtain a sheet-shaped device substrate 10 in which the line-shaped device substrates for red (R), green (G), and blue (B) are repeatedly arrayed.

Figure 8:
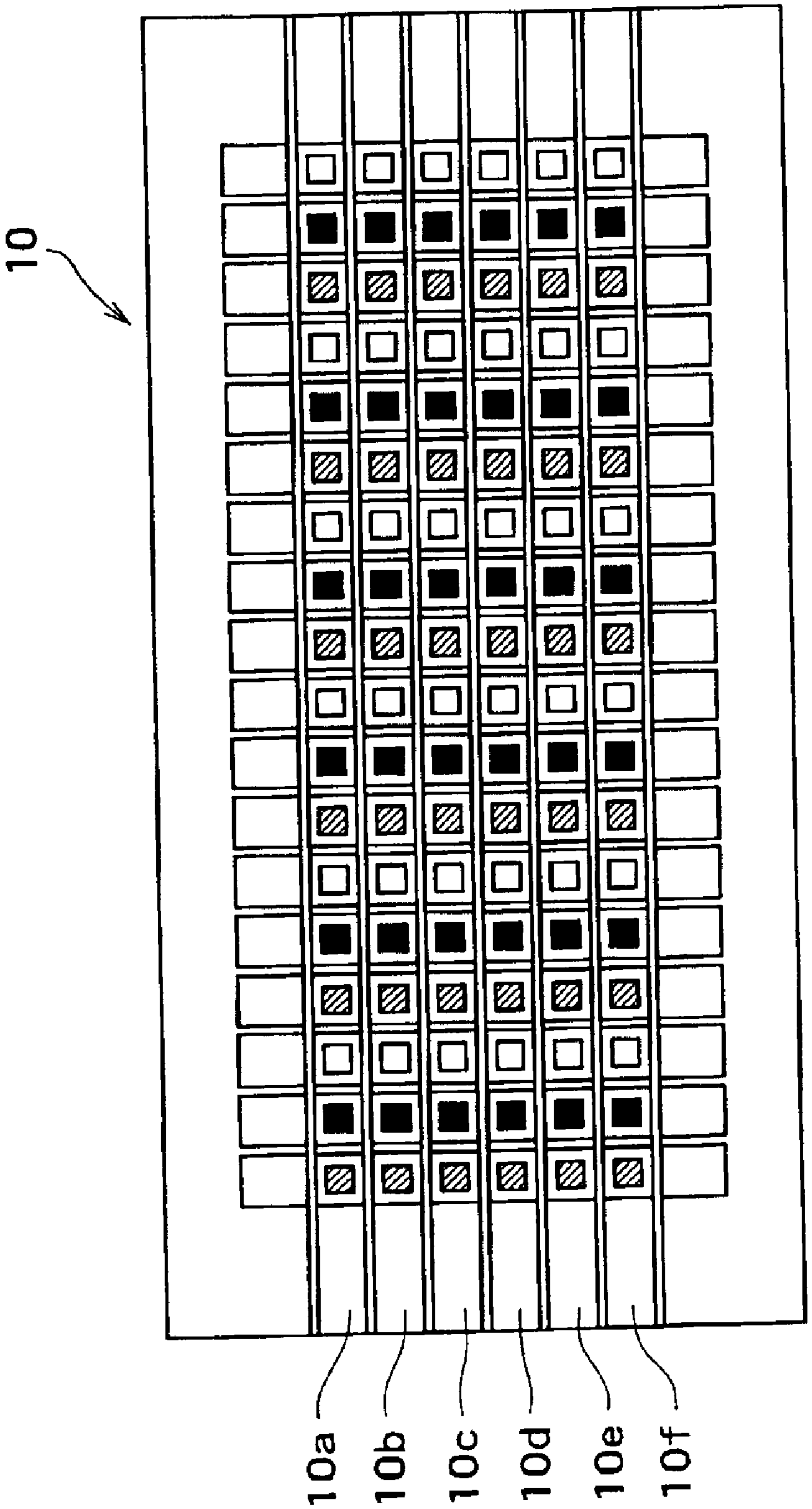
FIG. 8 is a plan view typically showing a state that the sheet-shaped device substrate shown in FIG. 7 is cut into line-shaped device substrates in each of which light emitting devices for emission of light of one of the three colors.

The sheet-shaped device substrate 10 is, as shown in FIG. 8, cut into a number (six pieces in this embodiment) of line-shaped device substrates 10*a,* 10*b,* 10*c,* 10*d,* 10*e* and 10*f* in each of which the light emitting devices are arrayed in a row. In this cutting step (secondary dicing step), the cutting direction is perpendicular to the cutting direction in the primary dicing step. To be more specific, the dicing is made so as to cross the line-shaped device substrates 1*a,* 1*b,* 1*c,* 1*d,* 1*e,* and 1*f* in each of which the light emitting devices for emission of red light are arrayed, the line-shaped device substrates 5*a,* 5*b,* 5*c,* 5*d,* 5*e,* and 5*f* in each of which the light emitting devices for emission of green light are arrayed, and the line-shaped device substrates 6*a,* 6*b,* 6*c,* 6*d,* 6*e,* and 6*f* in each of which the light emitting devices for emission of blue light are arrayed. In this dicing, the cutting width, that is, the distance between one and another cutting lines is set to a value corresponding to the width of one light emitting device. Consequently, as shown in FIG. 8, it is possible to obtain the line-shaped device substrates 10*a,* 10*b,* 10*c,* 10*d,* 10*e,* and 10*f* in each of which the light emitting devices for emission of light of red, green, and blue are repeatedly arrayed in a row.

The line-shaped devices 10*a,* 10*b,* 10*c,* 10*d,* 10*e,* and 10*f,* which have been divided from the sheet-shaped device substrate 10, are then transferred in array on a display substrate 7 (second transfer step), to accomplish a color image display unit. In the second transfer step, like the first transfer step, the line-shaped devices 10*a,* 10*b,* 10*c,* 10*d,* 10*e,* and 10*f* are transferred by selective transfer such as to be spaced from each other with an enlarged pitch.

Figure 9:
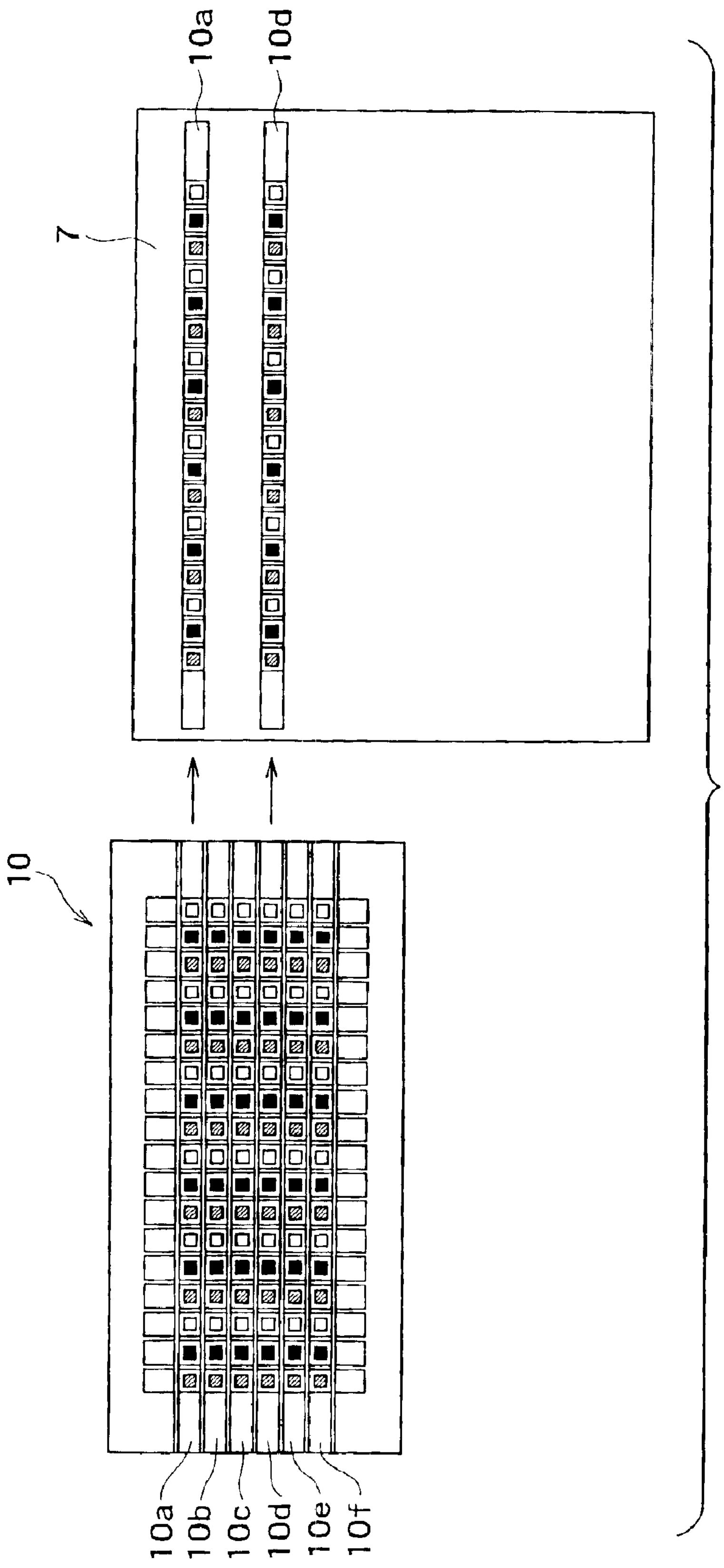
FIG. 9 is a typical view showing a first transfer in a secondary transfer step.
Figure 10:
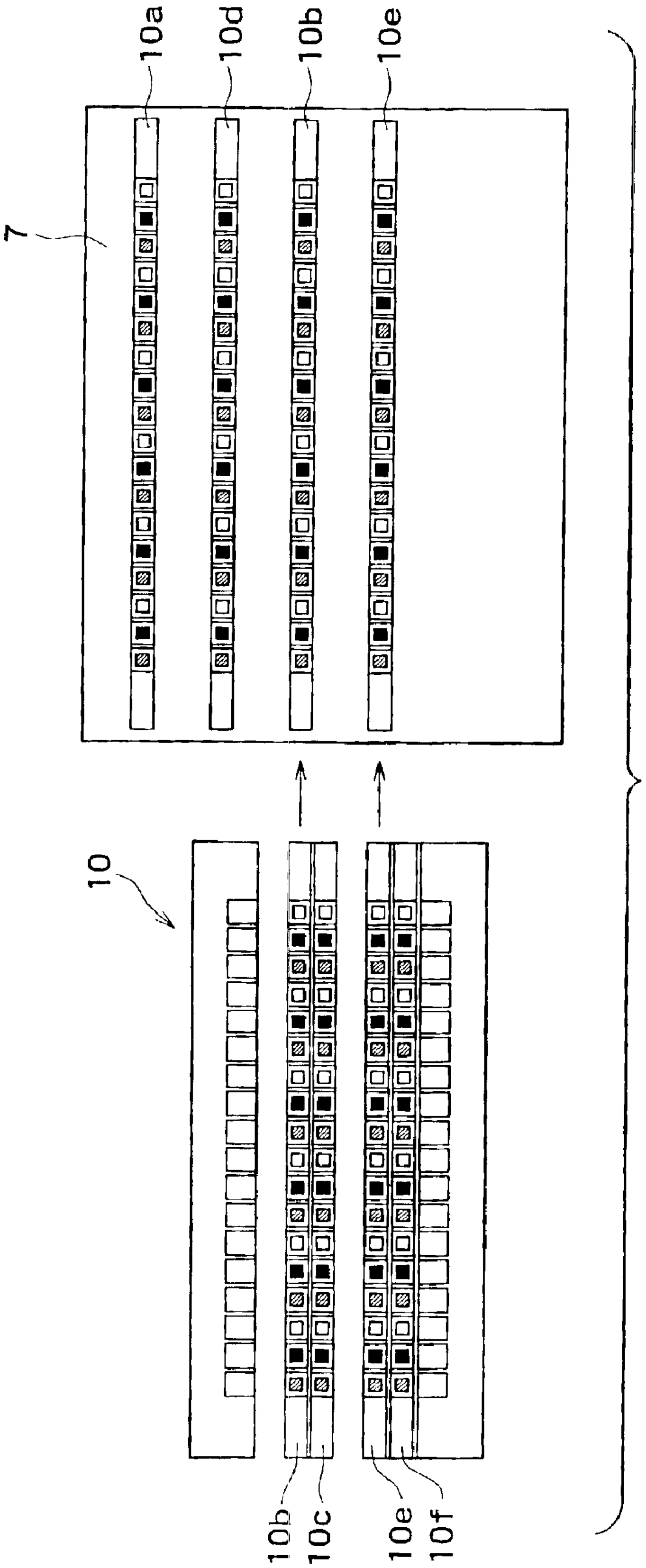
FIG. 10 is a typical view showing a second transfer in a secondary transfer step.
Figure 11:
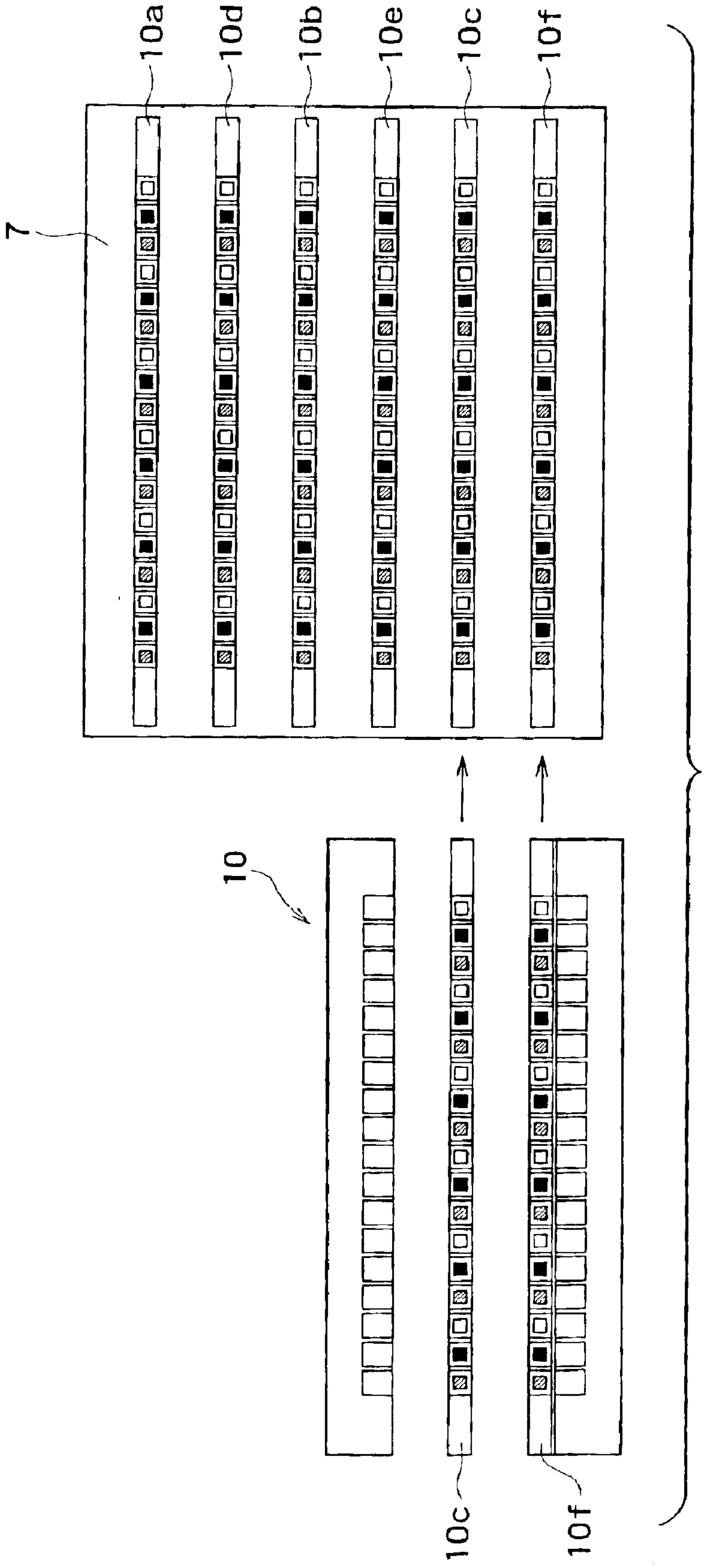
FIG. 11 is a typical view showing a third transfer in a secondary transfer step.

Specifically, first, as shown in FIG. 9, the line-shaped device substrates 10*a,* 10*b,* 10*c,* 10*d,* 10*e,* and 10*f* are selectively picked up every three rows, that is, the line-shaped device substrates 10*a* and 10*d* are picked up, and are transferred on the display substrate 7. Next, as shown in FIG. 10, the display substrate 7 is moved relative to the sheet-shaped device substrate 10, and the line-shaped devices 10*b,* 10*c,* 10*d* (empty), 10*e* and 10*f* are selectively picked up every three rows, that is, the line-shaped device substrates 10*b* and 10*e* are picked up, and are transferred on the display substrate 7. Finally, as shown in FIG. 11, the display substrate 7 is moved relative to the sheet-shaped device substrate 10, and the line-shaped devices 10*c,* 10*d* (empty), 10*e* (empty), and 10*f* are selectively picked up every three rows, that is, the remaining line-shaped device substrates 10*c* and 10*f* are picked up, and are transferred on the display substrate 7. As a result, the line-shaped device substrates 10*a,* 10*b,* 10*c,* 10*d,* 10*e,* and 10*f* have been transferred in an array on the display substrate 7 such as to be spaced from each other with a pitch enlarged by three times.

In the color image display unit thus fabricated, each of the line-shaped device substrates 10*a,* 10*b,* 10*c,* 10*d,* 10*e,* and 10*f* corresponds to a scanning line, and a color image is displayed by driving the light emitting devices for emission of light of red, green, and blue arrayed in each of the line-shaped device substrates 10*a,* 10*b,* 10*c,* 10*d,* 10*e,* and 10*f* in response to an image signal.

The configuration of the method of mounting a light emitting device and the method of fabricating an image display unit according to the present invention is not limited to the embodiments described above but may be variously changed. For example, in the above-described embodiments, the line-shaped device substrates are selectively picked up and are transferred to the primary base member or display substrate in the state being overlapped thereto. However, the line-shaped device substrates can be picked up one by one by a mechanical device, and be sequentially arrayed on the primary base member or display substrate. Since some portions of the line-shaped device substrate can be held, it is possible to stably perform the mechanical transfer. Further, since the light emitting devices arrayed in one row can be collectively held, it is possible to efficiently perform the mechanical transfer. Finally, since the array pitch of the light emitting devices in one line is not deviated, it is possible to array the light emitting devices with a high accuracy.

When transferring the line-shaped device substrates on the primary base member, an adhesive layer is not necessarily formed on the primary base member but may be fixed on the primary base member by making use of adhesiveness of the line-shaped device substrate. Through the fixture of the line-shaped device substrates without use of any adhesive layer, the transfer position can be easily corrected later.

One embodiment of the method of fabricating the above-described line-shaped device substrate will be described in detail below. As each of the light emitting devices buried in the line-shaped device substrate, there is used the GaN based light emitting diode shown in FIGS. 2A and 2B.

Figure 12:
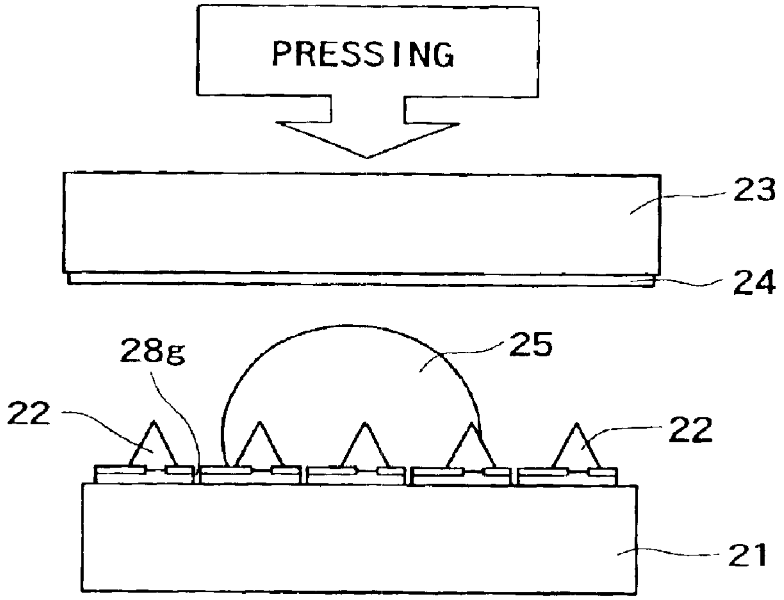

As shown in FIG. 12, a number of light emitting diodes 22 are densely formed on a principal plane of a first substrate 21. A size of the light emitting diode 22 can be made as fine as a size having one side of about 20 μm. The first substrate 21 is made from a material, having a high transmittance against a wavelength of a laser beam used for irradiation of the light emitting diode 22, for example, sapphire. The light emitting diode 22 is already provided with a p-electrode and the like but is not subjected to final wiring yet. Grooves 22*g* for device isolation are formed to allow the light emitting diodes 22 to be isolated from each other. The grooves 22*g* ate formed, for example, by reactive ion etching.

The light emitting diodes 22 on the first substrate 21 are transferred to a first temporarily holding member 23. As the first temporarily holding member 23, there can be used a glass substrate, a quartz glass substrate, or a plastic substrate. In this embodiment, the temporarily holding member 23 is configured as a quartz glass substrate. A peeling layer 24 functioning as a release layer is formed on the first temporarily holding member 23. The peeling layer 24 can be configured as a fluorine coat, or a layer made from a silicone resin, a water soluble adhesive (for example, polyvinyl alcohol: PVA), or polyimide. In this embodiment, the peeling layer 24 is configured as a layer made from polyimide.

Figure 13:
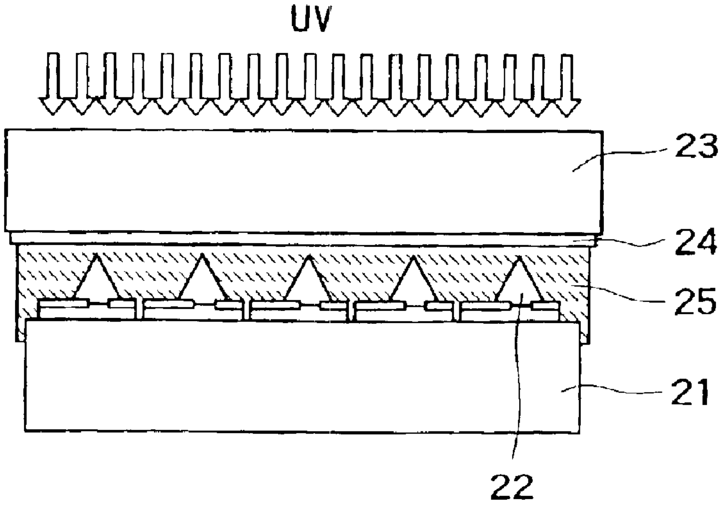

Before transfer, as shown in FIG. 12, the first substrate 21 is coated with an adhesive (for example, ultraviolet ray curing type adhesive) 25 in an amount sufficient to cover the light emitting diodes 22, and the first temporarily holding member 23 is overlapped to the first substrate 21 such as to be supported by the light emitting diodes 22. As shown in FIG. 13, the adhesive 25 is irradiated with ultraviolet rays (UV) traveling from the back side of the first temporarily holding member 23, to be cured. Since the first temporarily holding member 23 is the quartz glass substrate, the ultraviolet rays pass through the member 23, to quickly cure the adhesive 25.

Figure 14:
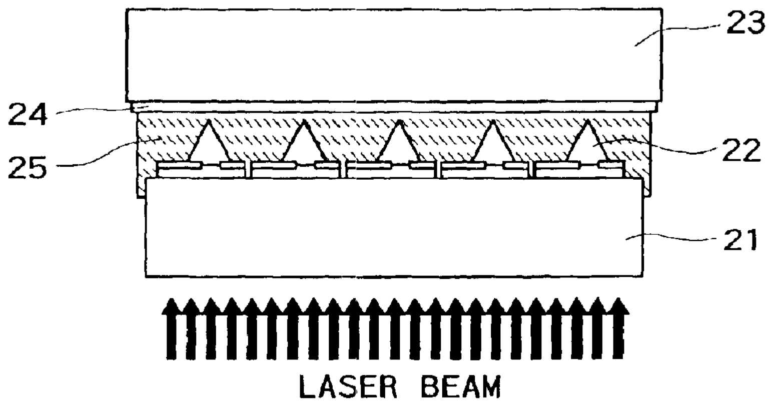

After the adhesive 25 is cured, as shown in FIG. 14, the light emitting diodes 22 are irradiated with laser beams traveling from the back side of the first substrate 21, to be peeled from the first substrate 21 by laser abrasion. Since the GaN based light emitting diode 22 is decomposed into gallium (Ga) and nitrogen at a boundary between the GaN layer and sapphire, the light emitting diode 22 can be relatively simply peeled. As the laser beam for irradiation, an excimer laser beam or a harmonic YAG laser beam is used. Each light emitting diode 22 is peeled from the first substrate 21 at the boundary between the GaN layer and the first substrate 21 by laser abrasion, and is transferred to the first temporarily holding member 23 in a state being buried in the adhesive 25.

Figure 15:
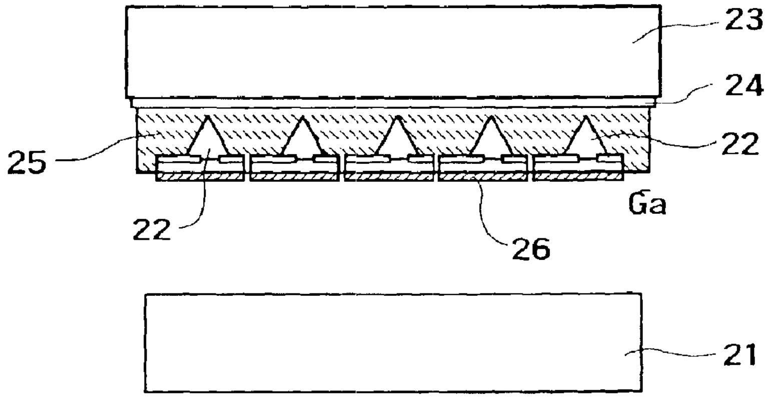
Figure 16:
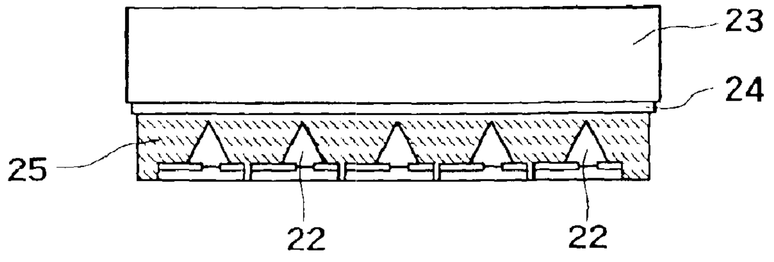

FIG. 15 shows a state that the first substrate 21 is removed by the above peeling. At this time, since the GaN based light emitting diodes 22 have been peeled from the first substrate 21 made from sapphire by laser abrasion, gallium (Ga) 26 is left as precipitated on the peeled plane. Such gallium (Ga) must be removed by etching. Concretely, as shown in FIG. 16, gallium (Ga) 26 is removed by wet etching using a water solution containing NaOH or diluted nitric acid.

Figure 17:
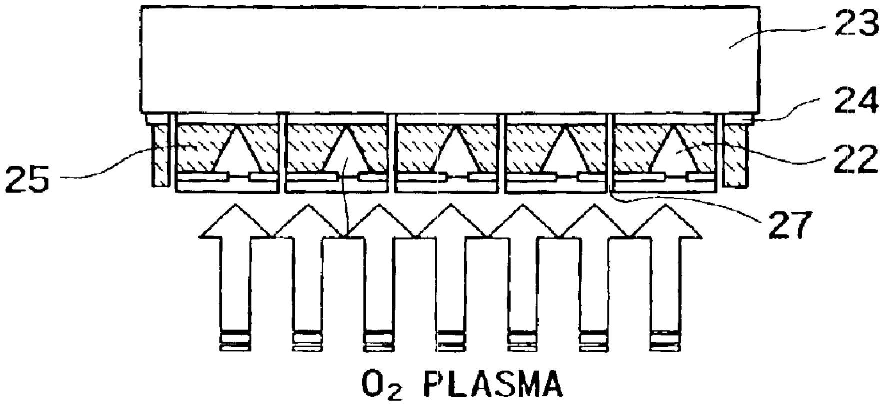

As shown in FIG. 17, the peeled plane is further cleaned by oxygen plasma ($O_2$ plasma), and dicing grooves 27 are formed in the adhesive 25 by dicing, to isolate the light emitting diodes 22 from each other. The light emitting diodes 22 are then selectively separated from the first temporarily holding member 23. The dicing process can be performed by a usual blade. If a narrow cut-in-depth of about 20 μm or less is required, the above cutting may be performed by laser. The cut-in-depth is dependent on a size of the light emitting diode 22 covered with the adhesive 25 within a pixel of an image display unit. As one example, the grooves are formed by irradiation of an excimer laser beam, to form a shape of each chip.

Figure 18:
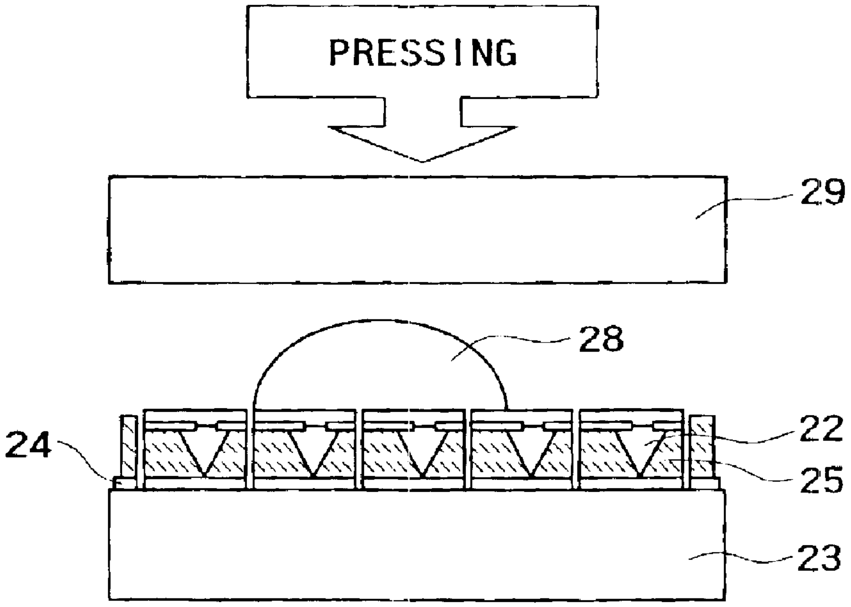

The selective separation of the light emitting diodes 22 are performed as follows. First, as shown in FIG. 18, the cleaned light emitting diodes 22 are coated with a thermoplastic resin type adhesive 28, and a second temporarily holding member 29 is overlapped to the adhesive 28. Like the first temporarily holding member 23, the second temporarily holding member 29 may be configured as a glass substrate, a quartz glass substrate, or a plastic substrate. In this embodiment, the second temporarily holding member 29 is configured as a quartz glass substrate. A peeling layer 30 made from polyimide is formed on the surface of the second temporarily holding member 29.

Figure 19:
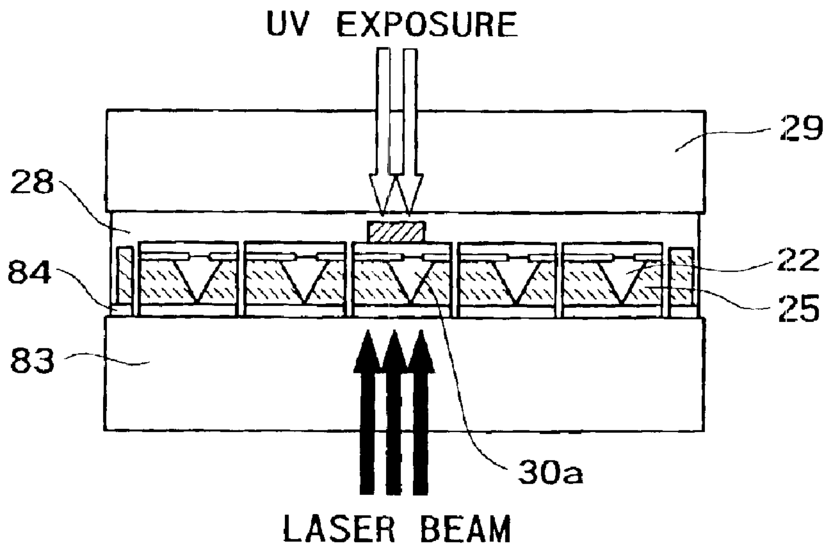
Figure 20:
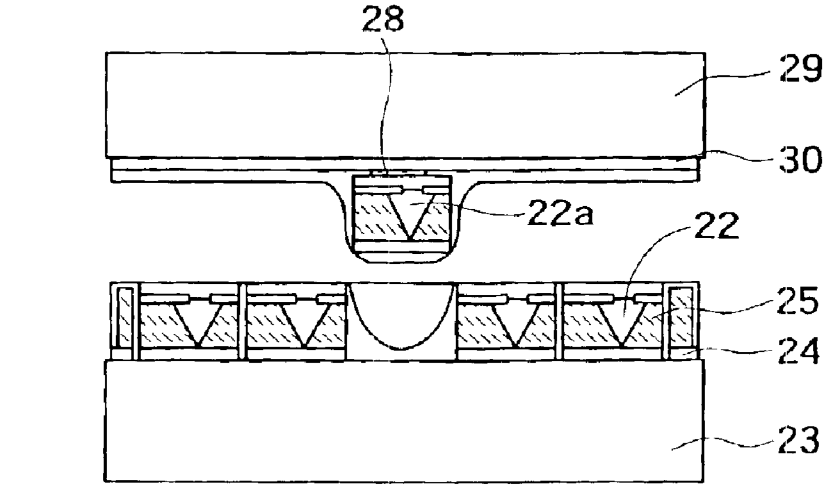

As shown in FIG. 19, a position, corresponding to a light emitting diode 22*a* to be transferred, of the first temporarily holding member 23 is irradiated with laser beams traveling from the back side of the first temporarily holding member 23, to peel the light emitting diode 22*a* from the first temporarily holding member 23 by laser abrasion. At the same time, a position, corresponding to the light emitting diode 22*a* to be transferred, of the second temporarily holding member 29 is irradiated with ultraviolet rays (UV) traveling from the back side of the second temporarily holding member 29, to cure an irradiated portion of the thermoplastic resin type adhesive 28. As a result, when the second temporarily holding member 29 is peeled from the first temporarily holding member 23, as shown in FIG. 20, only the light emitting diode 22*a* to be transferred is selectively separated from the first temporarily holding member 23 and is transferred to the second temporarily holding member 29.

Figure 21:
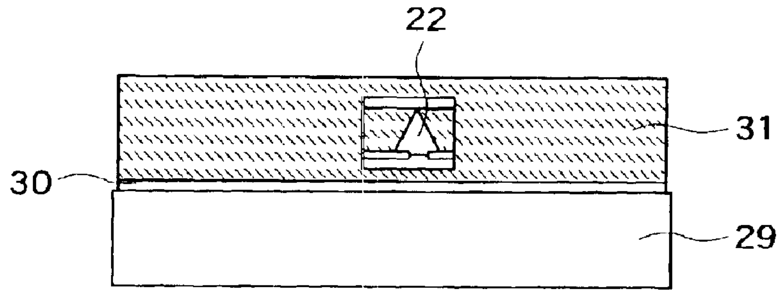
Figure 22:
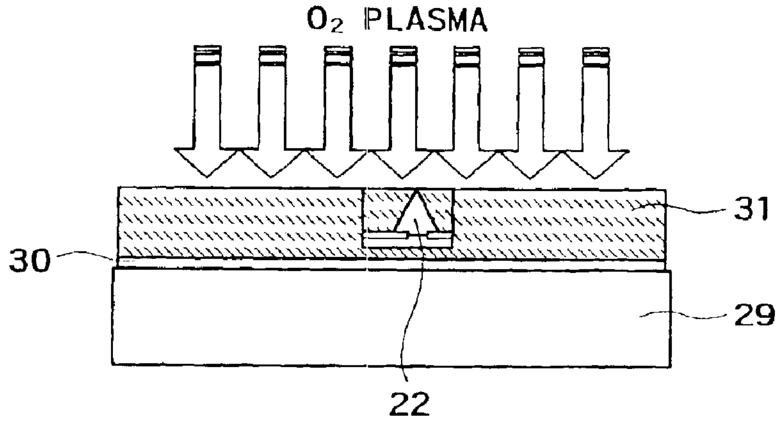
Figure 23:
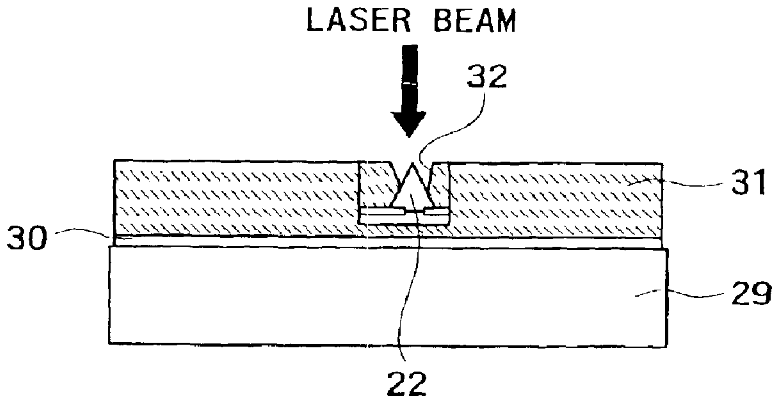
Figure 24:
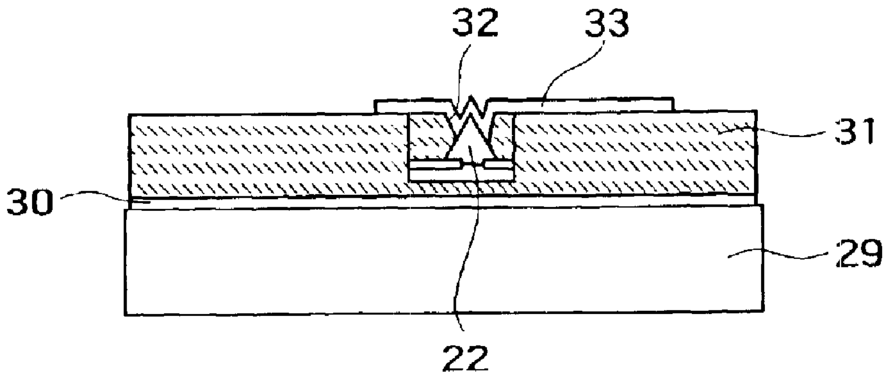

After selective separation of the light emitting diode 22, as shown in FIG. 21, a resin is applied to cover the transferred light emitting diode 22, to form a resin layer 31. Subsequently, as shown in FIG. 22, the thickness of the resin layer 31 is reduced by oxygen plasma or the like until the upper surface of the light emitting diode 22 is exposed. and as shown in FIG. 23, a via-hole 32 is formed at a position, corresponding to the light emitting diode 22, of the resin layer 31 by laser irradiation. The formation of the via-hole 32 may be performed by irradiation of an excimer laser beam, a harmonic YAG laser beam, or a carbon diode laser beam. A diameter of the via-hole 32 is typically set to a value ranging from about 3 to 7 μm.

Figure 25:
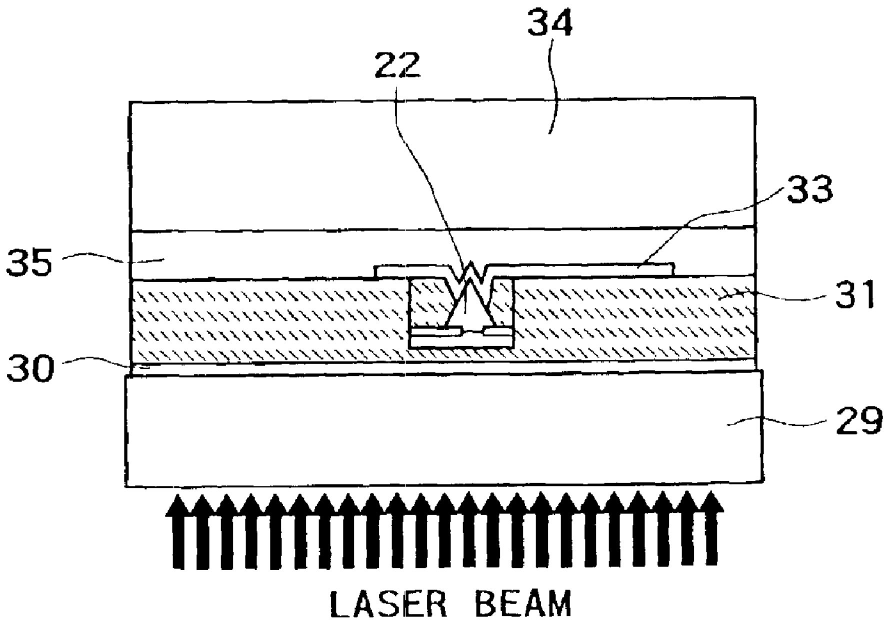
Figure 26:
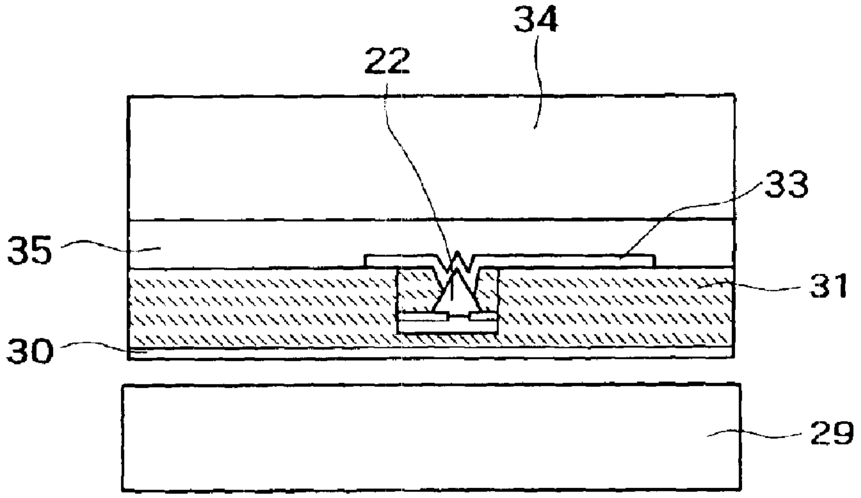

After formation of the anode side electrode pad 33, the light emitting diode 32 is transferred to a third temporarily holding member 34 for forming a cathode side electrode on the surface, opposed to the anode side electrode pad 33, of the light emitting diode 32. The third temporarily holding member 34 is typically made from quartz glass. Before transfer, as shown in FIG. 25, an adhesive 35 is applied to cover the light emitting diode 22 provided with the anode side electrode pad 33 and the resin layer 31, and then the third temporarily holding member 34 is stuck on the adhesive 35. Laser irradiation is performed from the back side of the second temporarily holding member 29, so that peeling by laser abrasion occurs at a boundary between the second temporarily holding member 29 made from quartz glass and the peeling layer 30 made from polyimide on the second temporarily holding member 29. As a result, the light emitting diode 22 and the resin layer 31 formed on the peeling layer 30 are transferred to the third temporarily holding member 34. FIG. 26 shows a state that the second temporarily holding member 29 is separated.

Figure 27:
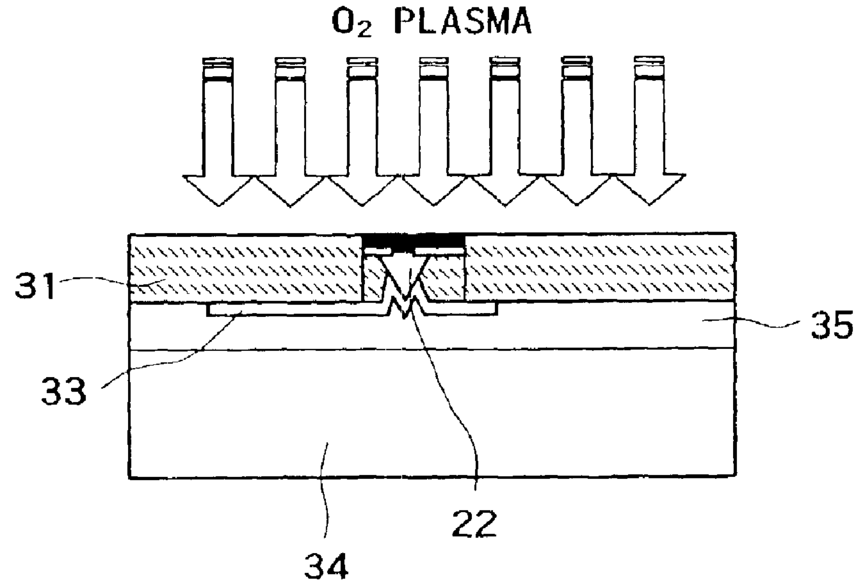
Figure 28:
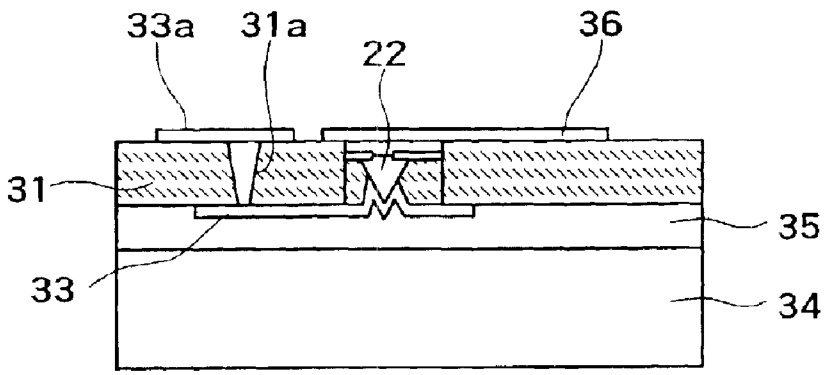

The formation of the cathode side electrode will be performed as follows. After the above-described transfer step, as shown in FIG. 27, the peeling layer 30 and the excess resin layer 31 are removed by $O_2$ plasma until a contact semiconductor layer (n-electrode) of the light emitting diode 22 is exposed. In the state that the light emitting diode 22 is held by the adhesive 35 of the third temporarily holding member 34, the back side of the light emitting diode 22 is taken as the n-electrode side (cathode electrode side). As shown in FIG. 28, an electrode pad 36 is formed so as to be electrically connected to the back surface of the light emitting diode 22.

The electrode pad 36 is then patterned. At this time a size of the cathode side electrode pad is typically set to about 60 μm square. As the electrode pad 36, there may be used a transparent electrode (ITO, ZnO based material, or the like), or an electrode made from Ti/Al/Pt/Au. In the case of using the transparent electrode, even if the electrode covers a large area of the back surface of the light emitting diode 22, it does not block light emission. Accordingly, the size of the electrode can be increased with a rough patterning accuracy, thereby facilitating the patterning process. In addition, when the electrode pad 36 is formed, an extraction electrode 33*a* connected to the previously formed anode side electrode pad 33 may be formed for facilitating a connection work in the mounting step. The extraction electrode 33*a* can be simply formed as follows: namely, a via-hole 31*a* is formed in the resin layer 31, and is buried with the layer made from ITO, ZnO, or Ti/Al/Pt/Au for forming the electrode pad 36, and the layer is patterned into the shape of the extraction electrode 33*a* at the time of forming the electrode pad 36 by patterning the layer.

Figure 29:
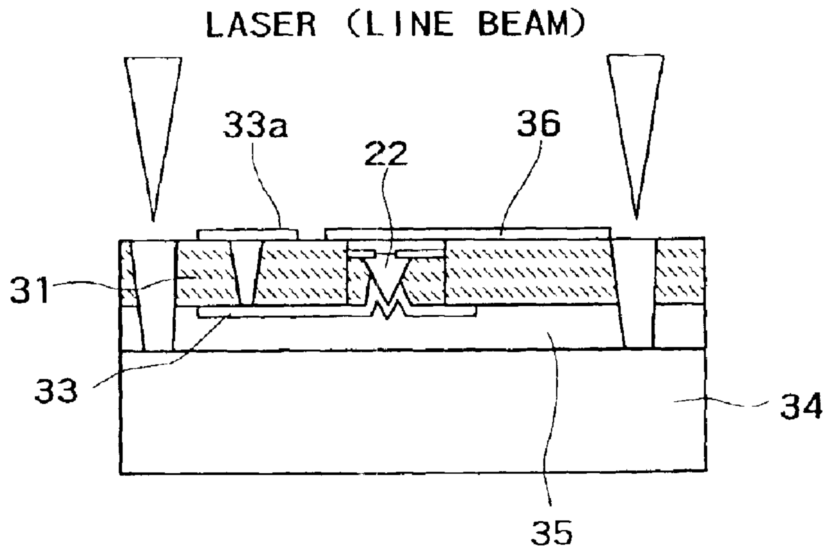

The third temporarily holding member 34 on which the light emitting devices 22 are left as fixed via the resin layer 31 and the adhesive 35 corresponds to the above-described sheet-shaped device substrate. The sheet-shaped device substrate is then cut into line-shaped device substrates. The cutting may be performed by laser dicing or the like. FIG. 29 shows the step of cutting the sheet-shaped device substrate by laser dicing. The laser dicing using a line laser beam is performed so as to cut the resin layer 31 and the adhesive 35 until the third temporarily holding member 34 is exposed.

The sheet-shaped device substrate is thus cut into line-shaped device substrates by laser dicing, and the line-shaped device substrates are subjected to the transfer step already described with reference to FIGS. 4 to 6.

In accordance with the above-described method of fabricating the line-shaped device substrates, the line-shaped device substrates in each of which the light emitting diodes for emission of light of red are arrayed are fabricated and transferred, and then the line-shaped device substrates in each of which the light emitting devices for emission of light of another color are arrayed are sequentially fabricated and transferred. This transfer step is followed by formation of electrodes and the like. The sheet-shaped device substrate obtained by the above transfer is again cut into line-shaped device substrates in each of which the light emitting devices for emission of light of red, green, and blue are repeatedly arrayed in one row. These line-shaped device substrates are then re-arrayed such as to be enlargedly spaced from each other, to produce a color image display unit.

Although the present invention has been described with reference to specific embodiments, those of skill in the art will recognize that changes may be made thereto without departing from the spirit and scope of the present invention as set forth in the hereafter appended claims.

What is claimed is:

1. A method of mounting a light emitting device, comprising the steps of:

arraying first light emitting device rows, in each of which light emitting devices are arrayed in a row, in parallel to each other;

cutting the first light emitting device rows such that the light emitting devices in each of the first light emitting device rows are separated from each other, to form second light emitting device rows in each of which the light emitting devices are arrayed in a row along a direction different from an array direction of the light emitting devices arrayed in each of the first light emitting device rows; and mounting the second light emitting device rows on a substrate.

2. A method of mounting a light emitting device, comprising the steps of:

transferring light emitting devices formed in an array on a first substrate to an insulating material, to form a sheet-shaped device substrate;

cutting the sheet-shaped device substrate along an array direction of the light emitting devices into long-sized line-shaped device substrates; and arraying the line-shaped device substrates on a second substrate such that the line-shaped device substrates are spaced from each other with an enlarged pitch, wherein the line-shaped device substrates are sets of the light emitting devices, each of the sets being composed of a line-shaped device substrate having light emitting devices for emission of red light, a line-shaped device substrate having light emitting devices for emission of green light, and a line-shaped device substrate having light emitting devices for emission of blue light, wherein the sets of line-shaped device substrates for red, green, and blue are repeatedly arrayed on the second substrate, wherein the second substrate is cut in a direction perpendicular to the cutting direction of the sheet-shaped device substrate, to form line-shaped device substrates in each of which the light emitting devices for emission of light of red, green, and blue are repeatedly arrayed on one row, wherein the line-shaped device substrates divided from the second substrate are arrayed on a third substrate such that the line-shaped device substrates are spaced from each other with an enlarged pitch.

3. A method of fabricating an image display unit, comprising the steps of:

transferring light emitting devices formed in an array on a first substrate to an insulating material, to form a sheet-shaped device substrate;

cutting the sheet-shaped device substrate along an array direction of the light emitting devices into long-sized line-shaped device substrates; and arraying the line-shaped device substrates on a second substrate such that the line-shaped device substrates are spaced from each other with an enlarged pitch, wherein the line-shaped device substrates are sets of the light emitting devices, each of the sets being composed of a line-shaped device substrate having light emitting devices for emission of red light, a line-shaped device substrate having light emitting devices for emission of green light, and a line-shaped device substrate having light emitting devices for emission of blue light, wherein the sets of line-shaped device substrates for red, green, and blue are repeatedly arrayed on the second substrate, wherein the second substrate is cut in a direction perpendicular to the cutting direction of the sheet-shaped device substrate, to form line-shaped device substrates in each of which the light emitting devices for emission of light of red, green, and blue are repeatedly arrayed on one row, and wherein the line-shaped device substrates divided from the second substrate are arrayed on a third substrate in such that the line-shaped device substrates are spaced from each other with an enlarged pitch.

* * * * *